(12) United States Patent
Liu et al.

(10) Patent No.: US 11,848,334 B2
(45) Date of Patent: Dec. 19, 2023

(54) DISPLAY PANEL, MANUFACTURING METHOD, ELECTRONIC DEVICE AND DISPLAY DEVICE

(71) Applicant: BOE TECHNOLOGY GROUP CO., LTD., Beijing (CN)

(72) Inventors: Jing Liu, Beijing (CN); Zihua Li, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 174 days.

(21) Appl. No.: 17/483,342

(22) Filed: Sep. 23, 2021

(65) Prior Publication Data

US 2022/0310661 A1 Sep. 29, 2022

(30) Foreign Application Priority Data

Mar. 24, 2021 (CN) .......................... 202110314899.4

(51) Int. Cl.
*H01L 27/12* (2006.01)

(52) U.S. Cl.
CPC ........ *H01L 27/124* (2013.01); *H01L 27/1259* (2013.01)

(58) Field of Classification Search
CPC .......................... H01L 27/124; H01L 27/1259
See application file for complete search history.

(56) References Cited

U.S. PATENT DOCUMENTS

| 5,757,450 A * | 5/1998 | Fujii | G02F 1/1345 349/151 |
| 6,587,176 B2 * | 7/2003 | Kim | G02F 1/1345 349/149 |
| 2011/0096258 A1 * | 4/2011 | Shim | H01L 27/1255 438/34 |

* cited by examiner

*Primary Examiner* — James A Dudek
(74) *Attorney, Agent, or Firm* — Myers Bigel, P.A.

(57) ABSTRACT

This disclosure proposes a display panel, a manufacturing method, an electronic device and a display device. The display panel includes a display area and a peripheral area surrounding the display area. The display panel includes a display substrate, a plurality of signal lines located on the display substrate, and the plurality of signal lines all extending from the peripheral area on one side of the display area to the peripheral area on the other side of the display area across the display area, at least one first compensation capacitor located in the peripheral area on the one side of the display area and corresponding to at least one of the plurality of signal lines, and at least one second compensation capacitor located in the peripheral area on the other side of the display area and corresponding to at least one of the plurality of signal lines.

17 Claims, 4 Drawing Sheets

```
┌─────────────────────────────────────────────────────────────────┐
│                   providing a display substrate                  │
└─────────────────────────────────────────────────────────────────┘
                                  │
┌─────────────────────────────────────────────────────────────────┐
│  forming a plurality of signal lines on the display substrate,   │
│  the plurality of signal lines being located on the display      │
│  substrate and the plurality of signal lines all extending from  │
│  the peripheral area on one side of the display area to the      │
│  peripheral area on the other side of the display area across    │
│  the display area                                                │
└─────────────────────────────────────────────────────────────────┘
                                  │
┌─────────────────────────────────────────────────────────────────┐
│  forming at least one first compensation capacitor and at least  │
│  one second compensation capacitor, wherein the at least one     │
│  first compensation capacitor is located in the peripheral area  │
│  on the one side of the display area and corresponds to at least │
│  one of the plurality of signal lines, and the at least one      │
│  second compensation capacitor is located in the peripheral area │
│  on the other side of the display area and corresponds to at     │
│  least one of the plurality of signal lines                      │
└─────────────────────────────────────────────────────────────────┘
```

Fig. 9

DISPLAY PANEL, MANUFACTURING METHOD, ELECTRONIC DEVICE AND DISPLAY DEVICE

RELATED APPLICATION

This disclosure claims the benefit of the Chinese Patent Application No. 202110314899.4 filed on Mar. 24, 2021, the entire disclosure of which is incorporated herein by reference.

FIELD

This disclosure relates to the field of display, particularly, to a display panel, a manufacturing method, an electronic device and a display device.

BACKGROUND

In Organic Light-Emitting Diode (OLED) products, data line wiring is generally carried out in the pixel area to realize the input of luminous signals. For special-shaped OLED products, such as circle, arc, oval, etc., it needs to design corresponding data line wiring according to the shape of the display panel. However, due to the limitation of the shape of the display panel, there may be difference in display effect between different pixel rows within the pixel area, and the performance of the display panel may be poor.

Therefore, the current display panel, manufacturing method, electronic device and display device still need to be improved.

SUMMARY

According to one aspect of this disclosure, a display panel is proposed, comprising a display area and a peripheral area surrounding the display area. The display panel comprises: a display substrate; a plurality of signal lines, the plurality of signal lines being located on the display substrate and the plurality of signal lines all extending from the peripheral area on one side of the display area to the peripheral area on the other side of the display area across the display area; at least one first compensation capacitor, the at least one first compensation capacitor being located in the peripheral area on the one side of the display area and corresponding to at least one of the plurality of signal lines; and at least one second compensation capacitor, the at least one second compensation capacitor being located in the peripheral area on the other side of the display area and corresponding to at least one of the plurality of signal lines.

Thus, the capacitance difference between the plurality of signal lines can be reduced by arranging the first compensation capacitor and the second compensation capacitor, so as to improve consistency of the input signals. Meanwhile, border width of the display panel can be reduced so as to improve the display quality and screen proportion of the display panel.

According to an embodiment of this disclosure, the display panel may further comprise: a first pad, the first pad being located in the peripheral area on the one side of the display area with the at least one first compensation capacitor; and a second pad, the second pad being located in the peripheral area on the other side of the display area with the at least one second compensation capacitor, wherein the first pad and the second pad are respectively arranged at symmetrical peripheral areas on two sides of the display area, and the signal lines are data lines.

Thus, the border width of the display panel can be further reduced.

According to an embodiment of this disclosure, a fan-out area is arranged between the second pad and the display area, and the at least one second compensation capacitor is located in the fan-out area.

Thus, the border width of the display panel can be further reduced.

According to an embodiment of this disclosure, the display panel may further comprise: a first gate layer, the first gate layer being located on a side of the display substrate; a second gate layer, the second gate layer being located on a side of the first gate layer away from the display substrate; a source drain layer, the source drain layer being located on a side of the second gate layer away from the first gate layer; and a power supply line, the power supply line being located in the source drain layer, wherein the plurality of signal lines are located in one of the first gate layer and the second gate layer, the at least one first compensation capacitor and the at least one second compensation capacitor are located in the other of the first gate layer and the second gate layer, and the power supply layer is connected with the at least one second compensation capacitor through a via hole.

Thus, the first compensation capacitor and the second compensation capacitor can be manufactured by a relatively simple method, and the manufacture process is simple.

According to an embodiment of this disclosure, the at least one second compensation capacitor may comprise a plurality of sub-capacitors and connecting blocks connecting the plurality of sub-capacitors.

Thus, parasitic capacitance can be reduced by arranging the connecting blocks.

According to an embodiment of this disclosure, each of the second compensation capacitors is connected with a power supply line, the second compensation capacitor with the connecting blocks corresponds to a plurality of signal lines.

Thus, the manufacture process can be further simplified.

According to an embodiment of this disclosure, each second compensation capacitor of the at least one second compensation capacitor can be connected with a power supply line, the second compensation capacitor comprising the plurality of sub-capacitors and the connecting blocks can correspond to a plurality of signal lines, wherein the number of the signal lines to which the second compensation capacitor comprising the plurality of sub-capacitors and the connecting blocks corresponds is equal to the number of the sub-capacitors comprised by the second compensation capacitor.

Thus, the influence of parasitic capacitance on the signal line can be reduced.

According to an embodiment of this disclosure, a distance between the connecting block and the second pad can be greater than 2.5 microns.

Thus, the border width of the display panel can be further reduced.

According to another aspect of this disclosure, a method of manufacturing a display panel is proposed. The display panel comprises a display area and a peripheral area surrounding the display area. The method comprises: providing a display substrate; forming a plurality of signal lines on the display substrate, the plurality of signal lines being located on the display substrate and the plurality of signal lines all extending from the peripheral area on one side of the display area to the peripheral area on the other side of the display area across the display area; and forming at least one first compensation capacitor and at least one second compensation capacitor, wherein the at least one first compensation capacitor is located in the peripheral area on the one side of the display area and corresponds to at least one of the plurality of signal lines, and the at least one second compensation capacitor is located in the peripheral area on the other side of the display area and corresponds to at least one of the plurality of signal lines.

The first compensation capacitor and the second compensation capacitor can be simply manufactured by the above method, so as to obtain the preceding display panel. Hence, the manufacturing method has all the features and advantages of the display panel described above, which will not be repeated here.

According to an embodiment of this disclosure, the step of forming the plurality of signal lines on the display substrate may comprise: forming, on the display substrate, a first insulating dielectric layer, a first gate layer, a second insulating dielectric layer and a second gate layer sequentially; and etching, when forming one of the first gate layer and the second gate layer, a gate metal using patterning process, so as to form the plurality of signal lines. The step of forming at least one first compensation capacitor and at least one second compensation capacitor may comprise: etching, when forming the other of the first gate layer and the second gate layer, a gate metal using patterning process, so as to form the first compensation capacitor and the second compensation capacitor.

Thus, the first compensation capacitor and the second compensation capacitor can be manufactured simply.

According to an embodiment of this disclosure, the method of manufacturing a display panel may further comprise: forming, on the second gate layer, a third insulating dielectric layer and a source drain layer sequentially; and etching, when forming the source drain layer, a source drain metal using patterning process, so as to form a power supply line, the power supply line and the second compensation capacitor being electrically connected through a via hole in the third insulating dielectric layer.

Thus, the power supply line can be manufactured simply.

According to an embodiment of this disclosure, the at least one second compensation capacitor may comprise a plurality of sub-capacitors and connecting blocks connecting the plurality of sub-capacitors, and each second compensation capacitor of the at least one second compensation capacitor is connected with a power supply line.

Thus, the influence of parasitic capacitance on the signal line can be reduced.

According to a further aspect of this disclosure, a display device is proposed, comprising a display panel according to the embodiments of this disclosure.

Thus, the display device has all the features and advantages of the display panel described above, which will not be repeated here.

According to yet another aspect of this disclosure, an electronic device is proposed, comprising a display panel according to the embodiments of this disclosure.

Thus, the electronic device has all the features and advantages of the display panel described above, which will not be repeated here.

BRIEF DESCRIPTION OF THE DRAWINGS

The above and/or additional aspects and advantages of this disclosure will become apparent and easy to understand from the description of the embodiments in combination with the following drawings below, wherein.

EMBODIMENTS

The embodiments of this disclosure will be described in detail below. The examples of the embodiments are shown in the drawings, wherein the same or similar reference signs throughout represent the same or similar elements or elements with same or similar functions. The embodiments described below with reference to the accompanying drawings are exemplary, which are merely used for explaining this disclosure and could not be interpreted as limitation to this disclosure.

This disclosure aims to solve one of the technical problems in related art to a certain extent.

Figure 1:
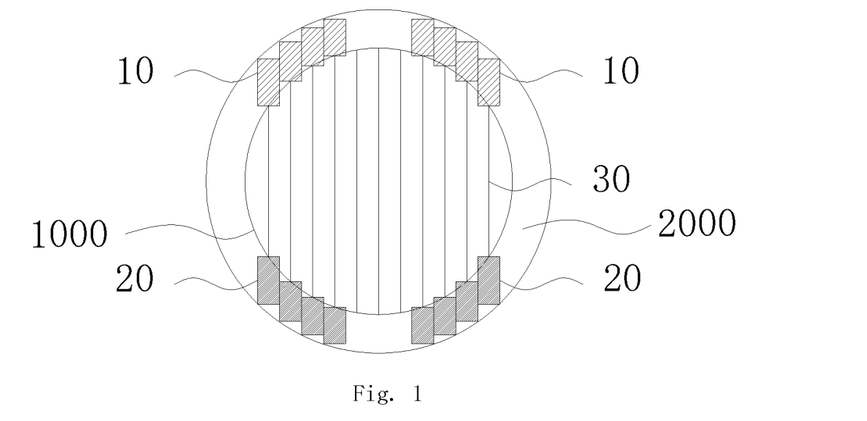
FIG. 1 shows a structural schematic view of a display panel according to an embodiment of this disclosure.
Figure 7:
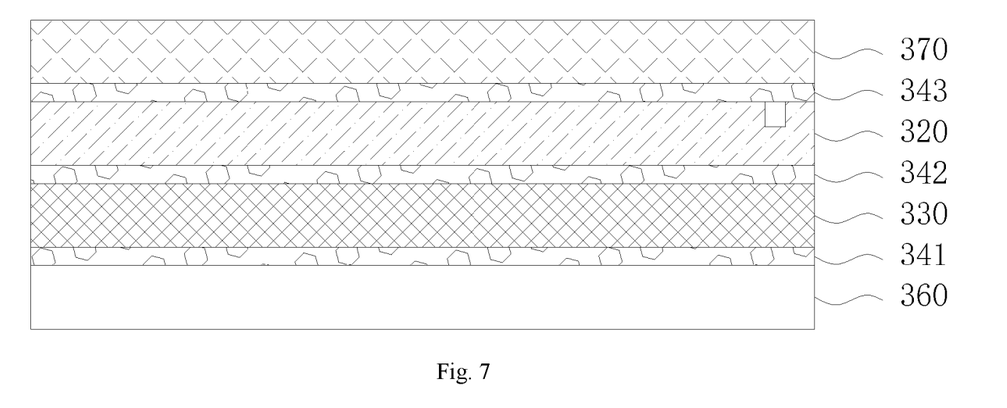
FIG. 7 shows a sectional view of a partial structure of a display panel according to an embodiment of this disclosure.

Referring to FIG. 1 and FIG. 7, this disclosure proposes a display panel. The display panel comprises a display area 1000 and a peripheral area 2000 surrounding the display area. The display panel comprises a display substrate 360 and a plurality of signal lines 30. The plurality of signal lines 30 are located on the display substrate 360 and the plurality of signal lines 30 all extend from the peripheral area 2000 on one side of the display area 1000 to the peripheral area 2000 on the other side of the display area 1000 across the display area 1000. The lengths of the plurality of signal lines 30 may not be exactly equal. The display panel comprises at least one first compensation capacitor 10 and at least one second compensation capacitor 20. The first compensation capacitor 10 is located in the peripheral area 2000 on the one side of the display area 1000 and corresponds to at least one signal line 30. The second compensation capacitor 20 is located in the peripheral area 2000 on the other side of the display area 1000 and corresponds to at least one signal line 30. Through the above arrangement of compensation capacitors, the border width of the display panel can be reduced effectively while reducing capacitance difference between the plurality of signal lines and improving consistency of the input signals, thereby improving the screen proportion of the display panel and obtaining a better display effect.

As mentioned above, in a special-shaped display panel, the lengths of a plurality of signal lines are not exactly equal. In order to ensure that the electrical signals transmitted by the plurality of signal lines are not affected by metal wires with different lengths (i.e., resistance of the signal line itself), signal lines with different lengths need to be compensated. Take the circular OLED products as an example, referring to FIG. 2, in order to match the shape of the display panel, the corresponding data line wiring design shall be carried out according to the shape of the display panel. That is to say, because there is a plurality of pixel rows with unequal number of sub-pixels in the display area 1000 of the special-shaped display panel, there is also a plurality of signal lines 30 with different lengths for providing signal inputs for the plurality of pixel rows. For signal lines 30 with different lengths, the capacitance values thereof are also different, finally it results in poor consistency of the signals transmitted to the plurality of pixel rows, as a result, the stability of signal input of special-shaped display panel is low and the display quality is poor. One compensation way is to arrange a metal block in the area overlapping with the signal line, so as to form capacitance between the metal block and the signal line, and adjust the size of the compensation capacitor by adjusting the area of the metal block, so as to realize consistency of the electrical signals between a plurality of signal lines. Specifically, capacitance compensation can be made to the corresponding signal line 30 by the first compensation capacitor 10' located in the peripheral area 2000 on one side of the display area 1000, so as to reduce capacitance difference between signal lines corresponding to different pixel rows of the display panel, thereby improving consistency of the input signals and improving the display quality. It could be understood by those skilled in the art that the metal block generally has a low transmittance, in order not to affect display effect, the metal block of the compensation capacitor is generally arranged within the peripheral area 2000. For example, the metal block is located in the peripheral area 2000 on the side of the display area 1000 close to the first pad.

Figure 2:
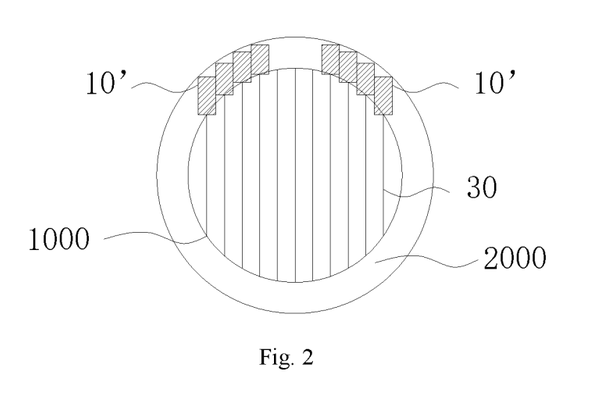
FIG. 2 shows a structural schematic view of a display panel in related art.

In order to make the compensation capacitance arranged to meet the effect of reducing the capacitance difference between signal lines, and in order to reduce the influence of adjacent compensation capacitors on parasitic capacitance generated by the signal lines, the width of the compensation capacitor is limited by the spacing between adjacent signal lines, as a result, the length of the compensation capacitor 10' is generally longer. In order to improve the aesthetics of the electronic device and the display device, the peripheral area 2000 around the display area 1000 of the display panel generally has the same width, so as to obtain a better appearance effect. Therefore, peripheral area 2000 on one side of the display area 1000 has a plurality of compensation capacitors with a long length, as a result, the overall width of the peripheral area 2000 of the display panel becomes larger, and the screen proportion of the display panel is reduced significantly.

The display panel according to an embodiment of this disclosure, by arranging a first compensation capacitor 10 and a second compensation capacitor 20, can make one signal line 30 to correspond to at least two metal blocks, so that the size of a single metal block can be reduced, thereby achieving the effect of narrowing the border. Take a circular OLED with a diameter of 1.39 inches and a signal line 30 with a line width of 3.5 microns as an example, it can be obtained from calculation that the maximum compensation capacitance (i.e., the pixel area closest to the center of the display area) required by the signal line 30 has a length of 4689.875 microns, whereas the range of compensation capacitance design allowed by the display panel is about 277292 microns (a quarter of circumference of a circular display panel), hence, the first compensation capacitor 10 and the second compensation capacitor 20 can be both designed on the routing area of the signal line 30 in the peripheral areas.

Referring to FIG. 1, the plurality of signal lines 30 all extend from the peripheral area 2000 on one side of the display area 1000 to the peripheral area 2000 on the other side of the display area 1000 across the display area 1000, a first compensation capacitor 10 is arranged on one side of the peripheral area 2000 and corresponds to at least one signal line 30, and a second compensation capacitor 20 is arranged on the other side of the peripheral area 2000 and corresponds to the at least one signal line 30. Thus, the first compensation capacitor 10 and the second compensation capacitor 20 can perform capacitance compensation to the corresponding signal line 30 together. Compared to the compensation capacitor arranged in the related art, because compensation capacitors (i.e., the first compensation capacitor 10 and the second compensation capacitor 20) are arranged in the peripheral areas on two sides of the display area at the same time, the compensation effect of the compensation capacitor arranged in the peripheral area on one side of the display area in the related art can be realized by the arrangement of both the first compensation capacitor 10 and the second compensation capacitor 20. That is to say, the capacitance difference between signal lines corresponding to different pixel rows of the display panel can be reduced by two compensation capacitor, i.e., the first compensation capacitor 10 and the second compensation capacitor 20 with smaller length, thereby improving consistency of the input signals and improving the display quality. Moreover, since the compensation capacitors are arranged in the peripheral areas on both sides of the display area 1000 and the length is shorter than that in the related art, the border width of the display panel in this disclosure is significantly reduced, the screen proportion of the display panel is significantly increased, and the display effect is better.

Figure 3:
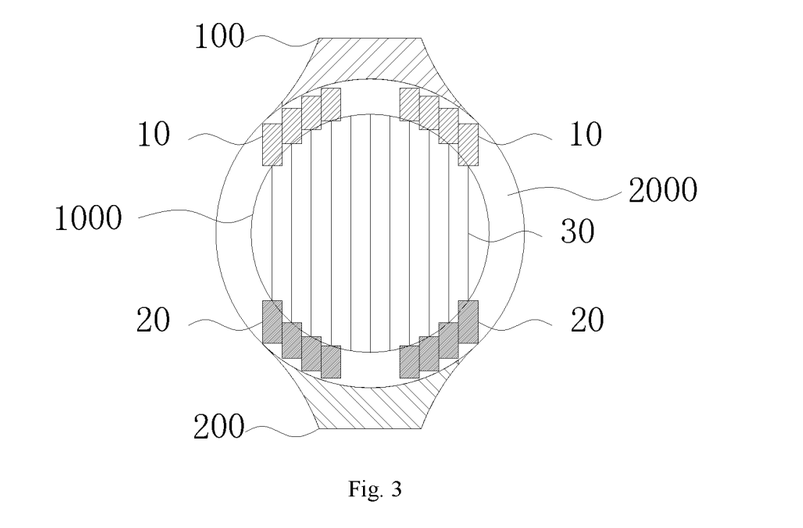
FIG. 3 shows another structural schematic view of a display panel according to an embodiment of this disclosure.

Referring to FIG. 3, the structure of the display panel is not particularly limited. For example, the display panel may further comprise: a first pad 100 located on one side of the peripheral area 2000, and the first compensation capacitor 10 is located on the side of the peripheral area 2000 with the first pad 100; and a second pad 200 located on the other side of the peripheral area 2000, and the second compensation capacitor 20 is located on the side of the peripheral area 2000 with the second pad 200. When the display panel has the first pad 100 and the second pad 200, and the first compensation capacitor 10 and the second compensation capacitor 20 are located at the above positions, it is convenient to effectively utilize the circuit design on the display panel in the related art, and it facilitates the routing and arrangement of the first compensation capacitor 10 and the second compensation capacitor 20.

According to an embodiment of this disclosure, the positions of the first pad 100 and the second pad 200 on the display panel are not particularly limited. For example, the first pad 100 and the second pad 200 can be arranged on symmetrical sides of the peripheral area 2000 on the display panel respectively. Thus, the panel utilization of the display panel can be improved effectively.

According to an embodiment of this disclosure, the type of the signal lines is not particularly limited. Specifically, the signal lines can be data lines, thus, luminous signals can be inputted to a plurality of pixel rows located in the display area 1000 through the signal lines.

Figure 4:
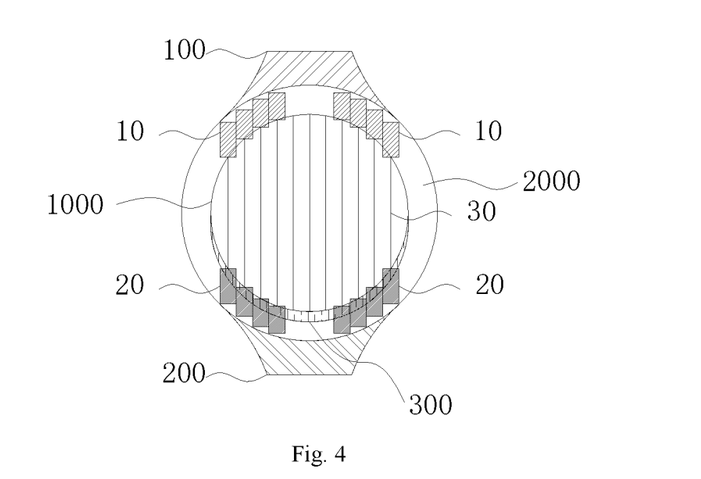
FIG. 4 shows a further structural schematic view of a display panel according to an embodiment of this disclosure.

Referring to FIG. 4, a fan-out area 300 is arranged between the second pad 200 and the display area 1000. The position of the second compensation capacitor 20 is not particularly limited. For example, when a fan-out area 300 is arranged between the second pad 200 and the display area 1000, the second compensation capacitor 20 can be located in the fan-out area 300. Thus, the second compensation capacitor 200 can be manufactured in the fan-out area 300 through a simple manufacture process, and the effect of capacitance compensation can be realized.

Referring to FIG. 7, the structure of the display panel is not particularly limited. For example, the display panel may comprise: a first gate layer 330 located on a side of the display substrate 360; a second gate layer 320 located on a side of the first gate layer 330 away from the display substrate 360; a source drain layer 370 located on a side of the second gate layer 320 away from the first gate layer 330; a first insulating dielectric layer 341 between the display substrate 360 and the first gate layer 330; a second insulating dielectric layer 342 between the first gate layer 330 and the second gate layer 320; and a third insulating dielectric layer 343 between the second gate layer 320 and the source drain layer 370. The plurality of signal lines 30 are located in one of the first gate layer 330 and the second gate layer 320. The first compensation capacitor 10 and the second compensation layer 20 are located in the other of the first gate layer 330 and the second gate layer 320. That is to say, when the plurality of signal lines 30 are located in the first gate layer 330, the first compensation capacitor 10 and the second compensation capacitor 20 may be located in the second gate layer 320. When the plurality of signal lines 30 are located in the second gate layer 320, the first compensation capacitor 10 and the second compensation capacitor 20 may be located in the first gate layer 330.

Figure 8:
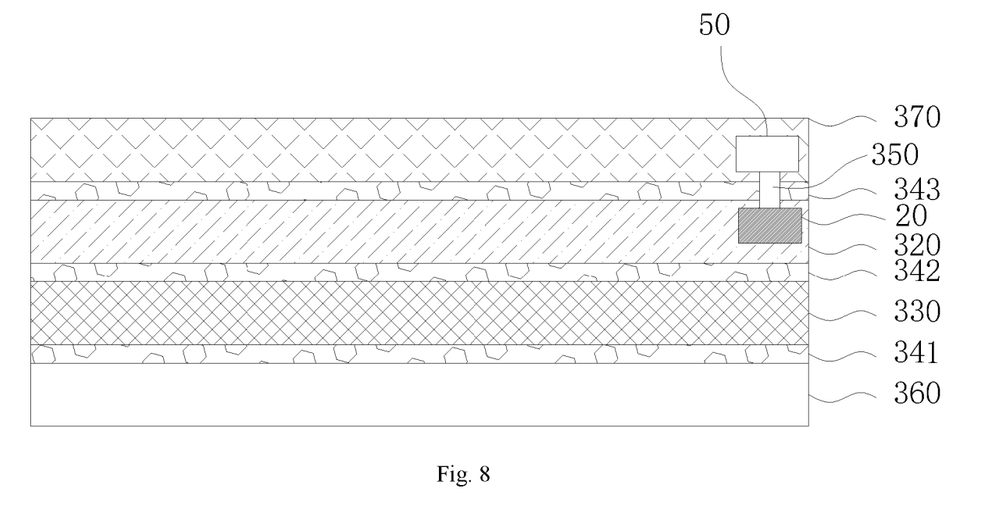
FIG. 8 shows a sectional view of another partial structure of a display panel according to an embodiment of this disclosure.

Referring to FIG. 8, the structure of the display panel is not particularly limited. For example, the display panel may further comprise a plurality of power supply lines 50 located in the source drain layer 370. The power supply line 50 is connected with the second compensation capacitor 20 through a via hole 350 in the third insulating dielectric layer 343. Thus, a voltage is provided to the second compensation capacitor 20 through the power supply line 50, so as to enable the second compensation capacitor 20 and the signal line 30 to form capacitance, thereby achieving the effect of capacitance compensation to the signal line 30. It should be particularly noted herein that the power supply line 50 can be a metal wire that provide a voltage. According to some embodiments of this disclosure, the power supply line 50 can be located in the source drain layer 370, specifically, it can be an anode/cathode power source line (VDD/VSS) of the display panel. Thus, the manufacture of the power supply line 50 and the compensation capacitor can be completed without increasing the production process. Specifically, since the first compensation capacitor 10 and the second compensation capacitor 20 are located in the first gate layer 330 or the second gate layer 320, and the first compensation capacitor 10 and the second compensation capacitor 20 are located in the peripheral area 2000, the increase of the first compensation capacitor 10 and the second compensation capacitor 20 does not affect the shape of the mask used for etching the first gate layer 330 or the second gate layer 320 in the display area 1000, only an opening needs to be added in the peripheral area 2000. The power supply line 50 is an anode/cathode power supply line, and the power supply line 50 can also be electrically connected with the first compensation capacitor 10 and the second compensation capacitor 20 at an appropriate position in the peripheral area 2000 by forming a via hole 350 without changing the original anode/cathode power supply line routing.

Figure 5:
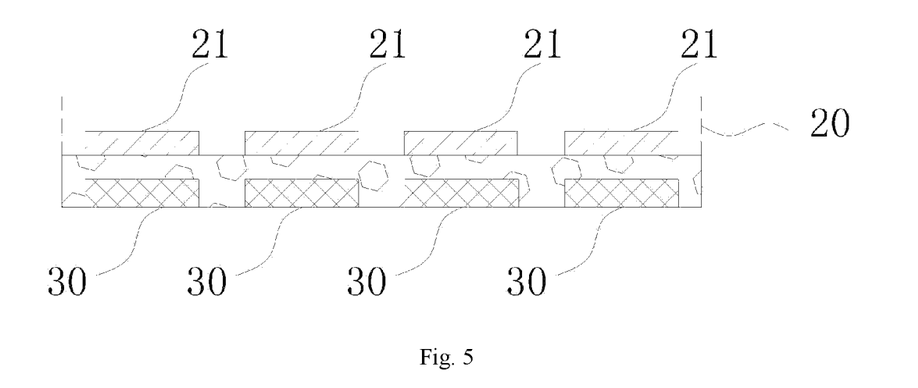
FIG. 5 shows a schematic view of longitudinal section of a partial structure of a display panel according to an embodiment of this disclosure.
Figure 6:
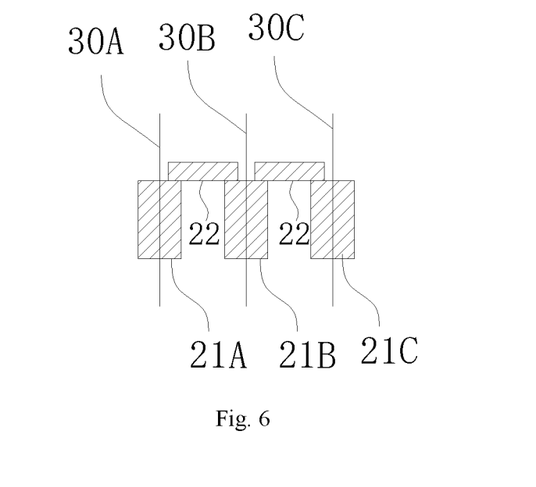
FIG. 6 shows a vertical view of the partial structure of FIG. 5 according to an embodiment of this disclosure.

Referring to FIG. 5 and FIG. 6, the structure of the second compensation capacitor 20 is not particularly limited. For example, the second compensation capacitor 20 may comprise a plurality of sub-capacitors 21 and connecting clocks 22 connecting the plurality of sub-capacitors 21. When the second compensation capacitor 20 comprises a plurality of sub-capacitors 21 and the plurality of sub-capacitors 21 are connected through the connecting clocks 22, each second compensation capacitor 20 can be connected with one power supply line 50 only, and the second compensation capacitor 20 with the connecting blocks 22 can correspond to a plurality of signal lines 30. Thus, the connecting line between the power supply line 50 and the second compensation capacitor 20 can be reduced through the arrangement of the connecting blocks 22, and the influence of the parasitic capacitance on the signal line 30 can be reduced.

According to some embodiments of this disclosure, the position of the connecting block 22 is not particularly limited. For example, the connecting blocks 22 together with a plurality of sub-capacitors 21 can be located in one layer of the first gate layer 330 and the second gate layer 320.

There is a capacitance between adjacent conductors separated by the insulating dielectric layer, hence, there is always mutual capacitance between the wirings on the circuit board. The non-designed capacitance formed between wires is called parasitic capacitance, and the parasitic capacitance may have a great impact on the circuit. For example, the signal line 30 is located in the first gate layer 330 and the second compensation capacitor 20 is located in the second gate layer 320, the signal line 30 and the corresponding second compensation capacitor 20 can be arranged in an alternating routing manner, and a second insulating dielectric layer 342 is provided between the first gate layer 330 and the second gate layer 320. That is to say, for each signal line 30, it is always affected by the second compensation capacitor 20 arranged at least corresponding to the adjacent signal line 30, and there is parasitic capacitance, resulting in the deterioration of the capacitance compensation effect of the compensation capacitor.

Referring to FIG. 5 and FIG. 6, for adjacent signal lines 30, taking 30A, 30B and 30C as examples, when each signal line 30 corresponds to a compensation capacitor individually, the capacitance values of the corresponding compensation capacitors thereof are close, so the compensation capacitors corresponding to each signal line 30 can be connected through the connecting blocks 22. That is to say, for the signal lines 30A, 30B and 30C, they correspond to three sub-capacitors 21A, 21B and 21C of the second compensation capacitor 20 respectively, and the three sub-capacitors 21A, 21B and 21C are connected through two connecting blocks 22. Thus, the adjacent data lines 30A, 30B and 30C can share the second compensation capacitor 20 formed by three sub-capacitors and two connecting blocks 22. Hence, the connecting line between the power supply line 50 and the second compensation capacitor 20 is reduced by arranging the connecting blocks, meanwhile, since the arrangement of the second compensation capacitor 20 is reduced, the influence of the parasitic capacitance on the signal line is significantly reduced.

It should be particularly noted that in actual applications, the number of signal lines 30 that connect the sub-capacitors 21 through the connecting block 22 and share the second compensation capacitor 20 is not particularly limited, as long as the capacitance value of the compensation capacitor required by each signal line 30 is relatively close, which can be selected by those skilled in the art based on actual conditions.

According to some embodiments of this disclosure, the distance between the connecting block 22 and the second pad 200 is not particularly limited, as long as the distance between the connecting block 22 and the second pad 200 is greater than 2.5 microns.

Figure 9:
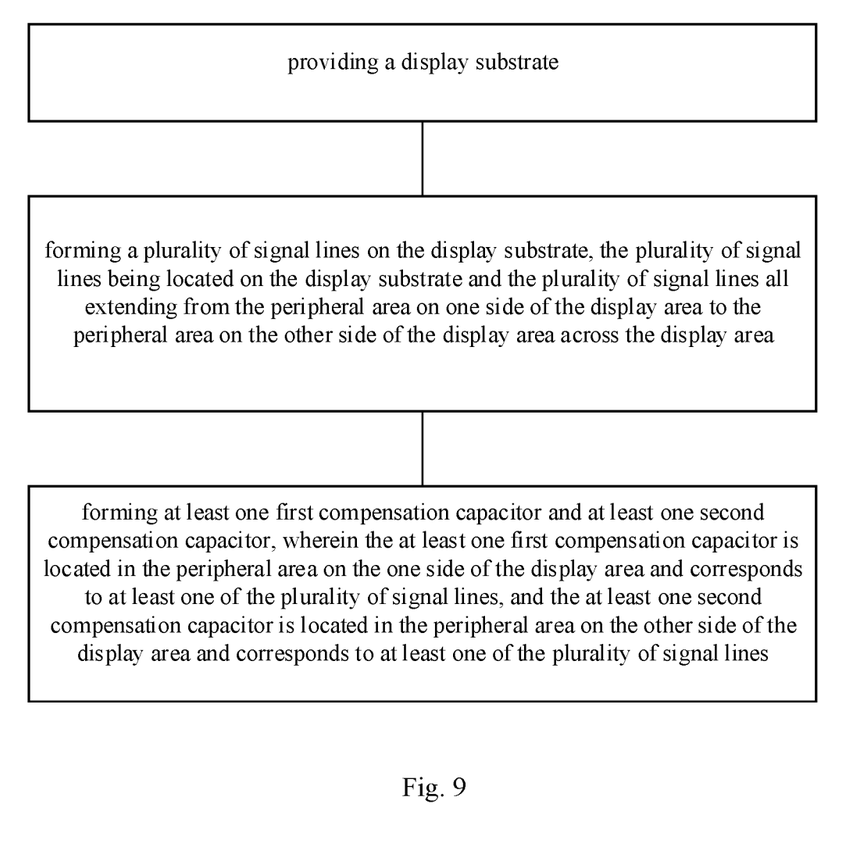
FIG. 9 shows a flow chart of a method of manufacturing a display panel according to an embodiment of this disclosure.

According to another aspect of this disclosure, a method of manufacturing the above display panel is proposed. Referring to FIG. 9, the method comprises steps S100 to S300.

At step S100, a display substrate is provided.

According to an embodiment of this disclosure, the specific shape and material of the display substrate are not particularly limited. For example, it can be a rigid substrate, such as glass, and it can also be a flexible substrate, for example, it can be formed of polymer materials such as PI. The step S100 may also include cutting the plate forming the display substrate to form a special shape, such as a circle.

At step S200, a plurality of signal lines are formed on the display substrate, and the plurality of signal lines are located on the display substrate and the plurality of signal lines all extend from the peripheral area on one side of the display area to the peripheral area on the other side of the display area across the display area.

At step S300, at least one first compensation capacitor and at least one second compensation capacitor are formed, the at least one first compensation capacitor is located in the peripheral area on the one side of the display area and corresponds to at least one of the plurality of signal lines, and the at least one second compensation capacitor is located in the peripheral area on the other side of the display area and corresponds to at least one of the plurality of signal lines.

According to an embodiment of this disclosure, the first compensation capacitor is located on one side of the peripheral area and corresponds to at least one signal line, and the second compensation capacitor is located on the other side of the peripheral area and corresponds to at least one signal line. The preceding display panel can be easily obtained by the above manufacturing method. Hence, the manufacturing method has all features and advantages of the display panel described above, which will not be repeated here.

According to some embodiments of this disclosure, the step of forming a plurality of signal lines as well as a first compensation capacitor and a second compensation capacitor comprises: forming, on the display substrate, a first insulating dielectric layer, a first gate layer, a second insulating dielectric layer and a second gate layer sequentially; etching, when forming one of the first gate layer and the second gate layer, a gate metal using patterning process, so as to form the plurality of signal lines; and etching, when forming the other of the first gate layer and the second gate layer, a gate metal using patterning process, so as to form the first compensation capacitor and the second compensation capacitor.

The display panel manufactured by the above method can manufacture the first compensation capacitor and the second compensation capacitor at the corresponding positions through an additional simple patterning process while manufacturing the conventional second gate layer. The process is simple and easy to operate and realize.

According to some embodiments of this disclosure, a third insulating dielectric layer and a source drain layer can be formed sequentially on the second gate layer, and the source drain gate metal is etched using the patterning process when the drain source layer is formed, so as to form a power supply line. The power supply line and the second compensation capacitor are electrically connected through a via hole in the third insulating dielectric layer, so that the power supply line can supply power to the second compensation capacitor.

According to some embodiments of this disclosure, the second compensation capacitor can comprise a plurality of sub-capacitors and connecting blocks connecting the plurality of sub-capacitors, and each second compensation capacitor is connected with a power supply line, thereby reducing the connection between the second compensation capacitor and the power supply line, simplifying the manufacture process and reducing the manufacture difficulty of the display panel.

According to a further aspect of this disclosure, a display device is proposed, comprising a display panel according to the embodiments of this disclosure. Thus, the display device has all the features and advantages of the display panel described above, which will not be repeated here.

According to yet another aspect of this disclosure, an electronic device is proposed, comprising a display panel according to the embodiments of this disclosure. Thus, the electronic device has all the features and advantages of the display panel described above, which will not be repeated here.

In this disclosure, the description of the reference terms "one embodiment", "another embodiment" and the like means that the specific features, structures, materials or characteristics described in connection with the embodiment are included in at least one embodiment of this disclosure. In this disclosure, the schematic expression of the above terms does not have to be directed to the same embodiments or examples. Moreover, the specific features, structures, materials or characteristics described may be combined in any one or more embodiments or examples in a suitable manner. In addition, those skilled in the art may combine different embodiments or examples described in this disclosure as well as features of different embodiments or examples without contradiction.

Although the embodiments of this disclosure have been shown and described above, it could be understood that the above embodiments are exemplary and could not be understood as limitations on this disclosure. Those of ordinary skill in the art may change, amend, replace and modify the above embodiments within the scope of this disclosure.

The invention claimed is:

1. A display panel, comprising a display area and a peripheral area surrounding the display area, the display panel comprising:
a display substrate;
a plurality of signal lines, the plurality of signal lines located on the display substrate and the plurality of signal lines all extending from the peripheral area on one side of the display area to the peripheral area on the other side of the display area across the display area;
at least one first compensation capacitor, the at least one first compensation capacitor located in the peripheral area on the one side of the display area and corresponding to at least one of the plurality of signal lines; and
at least one second compensation capacitor, the at least one second compensation capacitor located in the peripheral area on the other side of the display area and corresponding to at least one of the plurality of signal lines,
the display panel further comprising:
a first gate layer, the first gate layer located on a side of the display substrate;
a second gate layer, the second gate layer located on a side of the first gate layer away from the display substrate;

a source drain layer, the source drain layer located on a side of the second gate layer away from the first gate layer; and a power supply line, the power supply line located in the source drain layer, wherein the plurality of signal lines are located in one of the first gate layer and the second gate layer, the at least one first compensation capacitor and the at least one second compensation capacitor are located in the other of the first gate layer and the second gate layer, and the power supply line is connected with the at least one second compensation capacitor through a via hole.

2. The display panel according to claim 1, further comprising:
a first pad, the first pad located in the peripheral area on the one side of the display area with the at least one first compensation capacitor; and
a second pad, the second pad located in the peripheral area on the other side of the display area with the at least one second compensation capacitor,
wherein the first pad and the second pad are respectively arranged at symmetrical peripheral areas on two sides of the display area, and the signal lines are data lines.

3. The display panel according to claim 2, wherein a fan-out area is arranged between the second pad and the display area, and the at least one second compensation capacitor is located in the fan-out area.

4. The display panel according to claim 1, wherein the at least one second compensation capacitor comprises a plurality of sub-capacitors and connecting blocks connecting the plurality of sub-capacitors.

5. The display panel according to claim 4,
wherein each second compensation capacitor of the at least one second compensation capacitor is connected with a power supply line, the second compensation capacitor comprising the plurality of sub-capacitors and the connecting blocks corresponds to a plurality of signal lines, and
wherein a number of the signal lines to which the second compensation capacitor comprising the plurality of sub-capacitors and the connecting blocks corresponds is equal to a number of the sub-capacitors comprised by the second compensation capacitor.

6. The display panel according to claim 4, wherein a distance between at least one of the connecting blocks and a second pad that is in the peripheral area on the other side of the display area is greater than 2.5 microns.

7. A method of manufacturing a display panel, the display panel comprising a display area and a peripheral area surrounding the display area, the method comprising:
providing a display substrate;
forming a plurality of signal lines on the display substrate, the plurality of signal lines located on the display substrate and the plurality of signal lines all extending from the peripheral area on one side of the display area to the peripheral area on the other side of the display area across the display area; and
forming at least one first compensation capacitor and at least one second compensation capacitor,
wherein the at least one first compensation capacitor is located in the peripheral area on the one side of the display area and corresponds to at least one of the plurality of signal lines, and the at least one second compensation capacitor is located in the peripheral area on the other side of the display area and corresponds to at least one of the plurality of signal lines, and wherein the forming the plurality of signal lines on the display substrate comprises:
forming, on the display substrate, a first insulating dielectric layer, a first gate layer, a second insulating dielectric layer and a second gate layer sequentially; and
etching, when forming one of the first gate layer and the second gate layer, a gate metal using patterning process, so as to form the plurality of signal lines,
wherein the forming at least one first compensation capacitor and at least one second compensation capacitor comprises:
etching, when forming the other of the first gate layer and the second gate layer, a gate metal using patterning process, so as to form the first compensation capacitor and the second compensation capacitor.

8. The method according to claim 7, further comprising:
forming, on the second gate layer, a third insulating dielectric layer and a source drain layer sequentially; and
etching, when forming the source drain layer, a source drain metal using patterning process, so as to form a power supply line, the power supply line and the second compensation capacitor electrically connected through a via hole in the third insulating dielectric layer.

9. The method according to claim 8, wherein the at least one second compensation capacitor comprises a plurality of sub-capacitors and connecting blocks connecting the plurality of sub-capacitors, and each second compensation capacitor of the at least one second compensation capacitor is connected with a power supply line.

10. A display device, comprising a display panel as claimed in claim 1.

11. An electronic device, comprising a display panel as claimed in claim 1.

12. The display device according to claim 10, wherein the display panel further comprises:
a first pad, the first pad located in the peripheral area on the one side of the display area with the at least one first compensation capacitor; and
a second pad, the second pad located in the peripheral area on the other side of the display area with the at least one second compensation capacitor,
wherein the first pad and the second pad are respectively arranged at symmetrical peripheral areas on two sides of the display area, and the signal lines are data lines.

13. The display device according to claim 12, wherein a fan-out area is arranged between the second pad and the display area, and the at least one second compensation capacitor is located in the fan-out area.

14. The display device according to claim 10, wherein the at least one second compensation capacitor comprises a plurality of sub-capacitors and connecting blocks connecting the plurality of sub-capacitors.

15. The display device according to claim 14,
wherein each second compensation capacitor of the at least one second compensation capacitor is connected with a power supply line, the second compensation capacitor comprising the plurality of sub-capacitors and the connecting blocks corresponds to a plurality of signal lines, and
wherein a number of the signal lines to which the second compensation capacitor comprising the plurality of sub-capacitors and the connecting blocks corresponds is equal to a number of the sub-capacitors comprised by the second compensation capacitor.

16. The display device according to claim 14, wherein a distance between at least one of the connecting blocks and a second pad that is in the peripheral area on the other side of the display area is greater than 2.5 microns.

17. The electronic device according to claim 11, wherein the display panel further comprises:
- a first pad, the first pad located in the peripheral area on the one side of the display area with the at least one first compensation capacitor; and
- a second pad, the second pad located in the peripheral area on the other side of the display area with the at least one second compensation capacitor,
- wherein the first pad and the second pad are respectively arranged at symmetrical peripheral areas on two sides of the display area, and the signal lines are data lines.

* * * * *